US012612682B2

(12) United States Patent
Noguchi et al.

(10) Patent No.: US 12,612,682 B2
(45) Date of Patent: *Apr. 28, 2026

(54) COPPER-DIAMOND COMPOSITE, HEAT DISSIPATION MEMBER, AND ELECTRONIC DEVICE

(71) Applicant: Denka Company Limited, Tokyo (JP)

(72) Inventors: Hyojin Noguchi, Tokyo (JP); Noriyoshi Sakai, Tokyo (JP); Motoi Nagasawa, Tokyo (JP)

(73) Assignee: Denka Company Limited, Tokyo (JP)

( * ) Notice: Subject to any disclaimer, the term of this patent is extended or adjusted under 35 U.S.C. 154(b) by 139 days.

This patent is subject to a terminal disclaimer.

(21) Appl. No.: 18/681,230

(22) PCT Filed: Aug. 1, 2022

(86) PCT No.: PCT/JP2022/029486
§ 371 (c)(1),
(2) Date: Feb. 5, 2024

(87) PCT Pub. No.: WO2023/013579
PCT Pub. Date: Feb. 9, 2023

(65) Prior Publication Data
US 2024/0309495 A1 Sep. 19, 2024

(30) Foreign Application Priority Data
Aug. 5, 2021 (JP) ................................. 2021-128792

(51) Int. Cl.
*C22C 26/00* (2006.01)
*B22F 3/105* (2006.01)
(Continued)

(52) U.S. Cl.
CPC .............. *C22C 26/00* (2013.01); *B22F 3/105* (2013.01); *C22C 1/05* (2013.01); *C22C 9/00* (2013.01);
(Continued)

(58) Field of Classification Search
None
See application file for complete search history.

(56) References Cited

U.S. PATENT DOCUMENTS

2009/0057705 A1* 3/2009 Takashima .............. H01L 23/14
257/E21.575
2017/0045314 A1* 2/2017 Ishihara .................. C01B 32/28

FOREIGN PATENT DOCUMENTS

CN 111455205 A * 7/2020 .............. C22C 1/05
JP 2013-098491 5/2013
(Continued)

OTHER PUBLICATIONS

International Search Report and Written Opinion for International Application No. PCT/JP2022/029486 (filed Aug. 1, 2022), mailed Sep. 13, 2022.

*Primary Examiner* — Xiaobei Wang
(74) *Attorney, Agent, or Firm* — CHRISTENSEN O'CONNOR JOHNSON KINDNESS PLLC

(57) ABSTRACT
A copper-diamond composite (30) according to the present invention includes a plurality of diamond particles (20) that are dispersed in a metal matrix (10) containing copper, in which when a particle size distribution of the diamond particles (20) is measured using an image particle size distribution analyzer, a number average of a sphericity distribution of the diamond particles (20) is 0.90 or more.

14 Claims, 1 Drawing Sheet

(51) Int. Cl.
 C22C 1/05 (2023.01)
 C22C 9/00 (2006.01)
 H10W 40/25 (2026.01)

(52) U.S. Cl.
 CPC ... H10W 40/254 (2026.01); *B22F 2003/1051* (2013.01); *B22F 2202/13* (2013.01); *B22F 2301/10* (2013.01); *B22F 2302/406* (2013.01); *B22F 2998/10* (2013.01); *B22F 2999/00* (2013.01)

(56) References Cited

FOREIGN PATENT DOCUMENTS

| | | |
|---|---|---|
| JP | 2015-160996 | 9/2015 |
| WO | WO 2007/074720 | 7/2007 |
| WO | WO2016/035796 | 3/2016 |

* cited by examiner

100

COPPER-DIAMOND COMPOSITE, HEAT DISSIPATION MEMBER, AND ELECTRONIC DEVICE

CROSS-REFERENCE TO RELATED APPLICATIONS

This application is a U.S. National Stage Application of PCT/JP2022/029486, filed Aug. 1, 2022, which claims the benefit of JP 2021-128792, filed Aug. 5, 2021, the disclosures of which are incorporated herein in their entirety.

TECHNICAL FIELD

The present invention relates to a copper-diamond composite, a heat dissipation member, and an electronic device.

BACKGROUND ART

Various copper-diamond composites have been developed thus far. As this kind of technique, for example, a technique described in Patent Document 1 is known. Regarding a composite material of a metal matrix and thermally conductive particles, Patent Document 1 describes that an average particle system of highly thermally conductive particles such as diamond particles or SiC particles is 10 to 100 μm or less (for example, paragraph 0060).

RELATED DOCUMENT

Patent Document

[Patent Document 1] Pamphlet of International Publication No. WO2016/035796

SUMMARY OF THE INVENTION

Technical Problem

However, as a result of investigation by the present inventors, it was found that the composite material described in Patent Document 1 has room for improvement in terms of thermal conductivity.

Solution to Problem

As a result of further investigation, the present inventors found that the thermal conductivity of the copper-diamond composite can be improved by appropriately controlling the degree of sphericity of diamond particles in the composite. As a result of thorough investigation based on this finding, the present inventors found that the thermal conductivity of the composite can be improved by adjusting a number average of sphericity of the diamond particles obtained using an image particle size distribution analyzer to be a predetermined value or more, thereby completing the present invention.

According to one aspect of the present invention, a copper-diamond composite, a heat dissipation member, and an electronic device described below are provided.

1. A copper-diamond composite including:
a plurality of diamond particles that are dispersed in a metal matrix containing copper, in which
when a particle size distribution of the diamond particles is measured using an image particle size distribution analyzer, a number average of a sphericity distribution of the diamond particles is 0.90 or more.

2. The copper-diamond composite according to 1, in which
a sphericity $S_{50}$ corresponding to a cumulative value of 50% in a volume particle size distribution of sphericity of the diamond particles is 0.87 or more.

3. The copper-diamond composite according to 1 or 2, in which
a sphericity $S_{90}$ corresponding to a cumulative value of 90% in a volume particle size distribution of sphericity of the diamond particles is 0.91 or more.

4. The copper-diamond composite according to any one of 1 to 3, in which
a sphericity $S_{10}$ corresponding to a cumulative value of 10% in a volume particle size distribution of sphericity of the diamond particles is 0.8 or more.

5. The copper-diamond composite according to any one of 1 to 4, in which
a number average of a particle diameter distribution of the diamond particles is 180 μm or less.

6. The copper-diamond composite according to any one of 1 to 5, in which
a particle diameter $D_{50}$ corresponding to a cumulative value of 50% in a volume particle size distribution of particle diameter of the diamond particles is 180 μm or less.

7. The copper-diamond composite according to any one of 1 to 6, in which
a particle diameter $D_{90}$ corresponding to a cumulative value of 90% in a volume particle size distribution of particle diameter of the diamond particles is 210 μm or less.

8. The copper-diamond composite according to any one of 1 to 7, in which
a particle diameter $D_{10}$ corresponding to a cumulative value of 10% in a volume particle size distribution of particle diameter of the diamond particles is 160 μm or less.

9. The copper-diamond composite according to any one of 1 to 8, in which
a sphericity of the diamond particles belonging to a range where a particle diameter of the diamond particles is more than a particle diameter $D_{50}$ and equal to or less than a particle diameter $D_{90}$ is 0.90 or more.

10. The copper-diamond composite according to any one of 1 to 9, in which
a sphericity of the diamond particles belonging to a range where a particle diameter of the diamond particles is more than a particle diameter $D_{10}$ and equal to or less than a particle diameter $D_{50}$ is 0.90 or more.

11. The copper-diamond composite according to any one of 1 to 10, in which
a thermal conductivity is 610 W/m·K or higher.

12. The copper-diamond composite according to any one of 1 to 11, in which
a volume content ratio of the diamond particles is 10 vol % or more.

13. A heat dissipation member including:
the copper-diamond composite according to any one of 1 to 12; and
a metal film that is joined to at least one face of the copper-diamond composite.

14. An electronic device including:
the heat dissipation member according to 13; and
an electronic component that is provided over the heat dissipation member.

Advantageous Effects of Invention

According to the present invention, a copper-diamond composite having excellent thermal conductivity, and a heat dissipation member and an electronic device including the same copper-diamond composite are provided.

DESCRIPTION OF EMBODIMENTS

Figure 1:
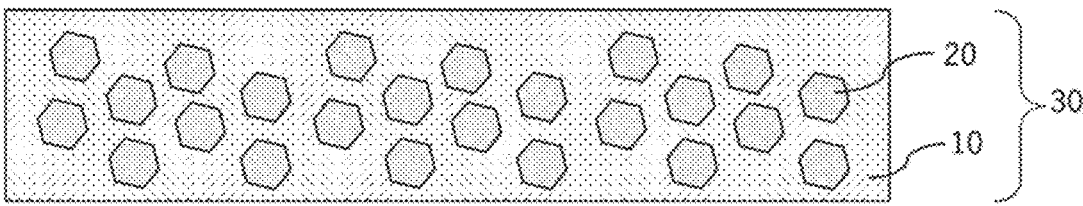
FIG. 1 is a schematic cross-sectional view illustrating an example of a configuration of a copper-diamond composite according to an embodiment.

Hereinafter, an embodiment of the present invention will be described using the drawings. In all of the drawings, the same components will be represented by the same reference numerals, and the description thereof will not be repeated. In addition, the diagrams are schematic diagrams, in which a dimensional ratio does not match the actual one.

The summary of a copper-diamond composite according to the present embodiment will be described using FIG. 1.

FIG. 1 is a schematic cross-sectional view illustrating an example of a configuration of the copper-diamond composite according to the present embodiment.

The copper-diamond composite 30 according to the present embodiment has a structure in which a plurality of diamond particles 20 are dispersed in a metal matrix 10 containing copper.

The copper-diamond composite 30 is configured such that, when a particle size distribution of the diamond particles 20 is measured using an image particle size distribution analyzer, a number average of a sphericity distribution of the diamond particles 20 is 0.90 or more.

According to the findings by the present inventors, it has been found that the thermal conductivity of the copper-diamond composite can be stably evaluated by using the sphericity of the diamond particles as an index, and it has been also found that the thermal conductivity of the composite can be improved by using the diamond particles where the sphericity is a predetermined value or more.

The detailed mechanism is not clear but is presumed to be that, since the frequency of fracture, cracking, or the like caused by contact between the particles in the process of filling or the like can be reduced by using the diamond particles having a high sphericity, a decrease in thermal conductivity caused by the damage of the diamond particles can be suppressed.

In addition, the diamond particles having a high sphericity can be filled in the metal matrix with high density. Therefore, the thermal conductivity of the composite can be further improved.

The sphericity or the particle diameter of the diamond particles 20 can be measured in the following procedure.

The particle size distribution of the diamond particles 20 is measured using an image particle size distribution analyzer (for example, Morphologi 4, manufactured by Malvern Panalytical Ltd.). The particle size distribution includes a shape distribution or a particle diameter distribution.

A volume particle size distribution of sphericity or a volume particle size distribution of particle diameter is generated from the obtained particle size distribution.

In the volume particle size distribution of sphericity of the diamond particles 20, a sphericity corresponding to a predetermined cumulative value or a particle diameter corresponding to a predetermined cumulative value is obtained.

In the volume particle size distribution of particle diameter of the diamond particles, a particle diameter $D_{10}$ corresponding to a cumulative value of 10%, a particle diameter $D_{50}$ corresponding to a cumulative value of 50%, and a particle diameter $D_{90}$ corresponding to a cumulative value of 90% are obtained.

In the volume particle size distribution of sphericity of the diamond particles, a sphericity $S_{10}$ corresponding to a cumulative value of 10%, a sphericity $S_{50}$ corresponding to a cumulative value of 50%, and a sphericity $S_{90}$ corresponding to a cumulative value of 90% are obtained.

In addition, in each of particle diameter classes where the particle diameters of the diamond particles are classified into four ranges including a range of the particle diameter $D_{10}$ or less, a range of more than the particle diameter $D_{10}$ and the particle diameter $D_{50}$ or less, a range of more than the particle diameter $D_{50}$ and the particle diameter $D_{90}$ or less, and a range of more than the particle diameter $D_{90}$, the sphericity is obtained.

In addition, in each of the particle diameter distribution and the shape distribution (sphericity distribution), a number average (number-based average particle diameter of the diamond particles) is calculated.

Here, the sphericity and the particle diameter are defined as follows.

Sphericity: a ratio between the circumferential length of a circle having the same area as a projected object and the circumferential length of the object Particle diameter: the maximum length between two points on the contour of a particle image The lower limit of the number average of the sphericity distribution of the diamond particles 20 is, for example, 0.90 or more, preferably 0.91 or more, and more preferably 0.92 or more. As a result, the filling density of the diamond particles 20 is enhanced, and the thermal conductivity of the copper-diamond composite 30 is enhanced.

On the other hand, the upper limit of the number average of the sphericity distribution of the diamond particles 20 is not particularly limited and may be 0.99 or less.

The lower limit of the sphericity $S_{50}$ of the diamond particles 20 is, for example, 0.87 or more, preferably 0.90 or more, and more preferably 0.92 or more. As a result, the filling density of the diamond particles 20 is enhanced, and the thermal conductivity of the composite is enhanced.

On the other hand, the upper limit of the sphericity $S_{50}$ of the diamond particles 20 is not particularly limited and may be 0.99 or less or may be 0.98 or less.

The lower limit of the sphericity $S_{90}$ of the diamond particles 20 is, for example, 0.91 or more, preferably 0.93 or more, and more preferably 0.95 or more. As a result, the filling density of the diamond particles 20 is enhanced, and the thermal conductivity of the composite is enhanced.

On the other hand, the upper limit of the sphericity $S_{90}$ of the diamond particles 20 is not particularly limited and may be 0.99 or less.

The lower limit of the sphericity $S_{10}$ of the diamond particles 20 is, for example, 0.80 or more, preferably 0.82 or more, and more preferably 0.85 or more. As a result, the filling density of the diamond particles 20 is enhanced, and the thermal conductivity of the composite is enhanced.

On the other hand, the upper limit of the sphericity $S_{10}$ of the diamond particles 20 is not particularly limited and may be 0.99 or less or may be 0.95 or less.

The upper limit of the number average of the particle diameter distribution of the diamond particles 20 is, for example, 180 μm or less, preferably 175 μm or less, and more preferably 170 μm or less. As a result, the filling density of the diamond particles 20 is enhanced, and the thermal conductivity of the composite is enhanced.

On the other hand, the lower limit of the number average of the particle diameter distribution of the diamond particles 20 is not particularly limited and is, for example, 30 μm or more, preferably 50 μm or more, and more preferably 100 μm or more. As a result, the entire area of an interface between the diamond particles 20 and a copper phase/copper alloy phase in the metal matrix 10 can be reduced, and an increase in thermal resistance can be suppressed. Therefore, the thermal conductivity characteristics of the copper-diamond composite can be improved.

The volume particle size distribution of particle diameter of the diamond particles may be configured to include one peak or may be configured to include two or more peaks.

The upper limit of the particle diameter $D_{50}$ of the diamond particles 20 is, for example, 180 μm or less, preferably 175 μm or less, and more preferably 170 μm or less. As a result, the filling density of the diamond particles 20 is enhanced, and the thermal conductivity of the composite is enhanced.

On the other hand, the lower limit of the particle diameter $D_{50}$ of the diamond particles 20 is not particularly limited and is, for example, 30 μm or more, preferably 50 μm or more, and more preferably 100 μm or more.

The upper limit of the particle diameter $D_{90}$ of the diamond particles 20 is, for example, 210 μm or less, preferably 200 μm or less, and more preferably 190 μm or less. As a result, the filling density of the diamond particles 20 is enhanced, and the thermal conductivity of the composite is enhanced.

On the other hand, the lower limit of the particle diameter $D_{90}$ of the diamond particles 20 is not particularly limited and is, for example, 30 μm or more, preferably 50 μm or more, and more preferably 110 μm or more.

The upper limit of the particle diameter $D_{10}$ of the diamond particles 20 is, for example, 160 μm or less, preferably 158 μm or less, and more preferably 155 μm or less. As a result, the filling density of the diamond particles 20 is enhanced, and the thermal conductivity of the composite is enhanced.

On the other hand, the lower limit of the particle diameter $D_{10}$ of the diamond particles 20 is not particularly limited and is, for example, 30 μm or more, preferably 50 μm or more, and more preferably 100 μm or more.

A sphericity of the diamond particles 20 belonging to a range where a particle diameter of the diamond particles 20 is more than the particle diameter $D_{50}$ and equal to or less than the particle diameter $D_{90}$ is, for example 0.90 or more, preferably 0.91 or more, and more preferably 0.92 or more. As a result, the filling density of the diamond particles 20 is enhanced, and the thermal conductivity of the composite is enhanced.

On the other hand, the upper limit of the sphericity of the diamond particles 20 is not particularly limited and may be 0.99 or less.

A sphericity of the diamond particles 20 belonging to a range where a particle diameter of the diamond particles 20 is more than the particle diameter $D_{10}$ and equal to or less than the particle diameter $D_{50}$ is, for example 0.90 or more, preferably 0.91 or more, and more preferably 0.92 or more. As a result, the filling density of the diamond particles 20 is enhanced, and the thermal conductivity of the composite is enhanced.

On the other hand, the upper limit of the sphericity of the diamond particles 20 is not particularly limited and may be 0.99 or less.

The summary of the configuration of the copper-diamond composite according to the present embodiment will be described in detail.

(Copper-Diamond Composite)

The copper-diamond composite 30 (hereinafter, also simply referred to as "composite") includes the metal matrix 10 containing copper and the plurality of diamond particles 20 present in the metal matrix 10.

The diamond particles 20 in the composite are in a state where all the plurality of particles are embedded in the metal matrix 10 but may be in a state where at least a part of one particle or two or more particles is exposed from the surface of the copper-diamond composite 30.

The lower limit of the thermal conductivity of the copper-diamond composite 30 is, for example, 610 W/m·K or higher, preferably 620 W/m·K or higher, and more preferably 630 W/m·K or higher. As a result, the heat dissipation characteristics of the heat dissipation member are enhanced.

On the other hand, the upper limit of the thermal conductivity of the copper-diamond composite 30 is not particularly limited and is, for example, 900 W/m·K or lower, preferably 890 W/m·K or lower, and more preferably 880 W/m·K or lower.

The shape and size of the copper-diamond composite 30 can be appropriately set depending on uses.

Examples of the shape of the copper-diamond composite 30 include a flat shape, a block shape, and a rod shape.

The metal matrix 10 only needs to contain copper or may contain other high thermal conductivity metal other than copper. That is, the metal matrix 10 may be formed of a copper phase and/or a copper alloy phase.

As a main component in the metal matrix 10, copper is preferable from the viewpoint of thermal conductivity or costs.

The lower limit of the content of copper as the main component with respect to 100 mass % of the metal matrix 10 is preferably 50 mass % or more, more preferably 60 mass % or more, still more preferably 70 mass % or more, still more preferably 80 mass % or more, and most preferably 90 mass % or more. As a result, excellent thermal conductivity of the copper and the copper alloy can be used. In addition, in order to ensure brazing property and surface smoothness, the same copper as the matrix can be used as a surface layer, and another surface coating layer does not need to be formed.

The upper limit of the content of copper as the main component with respect to 100 mass % of the metal matrix 10 is not particularly limited and may be 100 mass % or less or may be 99 mass % or less.

Examples of the other high thermal conductivity metal include silver, gold, and aluminum. These metals may be used alone or may be used in combination of two or more kinds. When copper and the other high thermal conductivity metal are used in combination, an alloy or a composite material formed of copper and the other high thermal conductivity metal can be used.

In the metal matrix 10, a metal or the like other than the high thermal conductivity metal is allowed within a range where the effect of the present invention does not deteriorate.

In addition, when the copper alloy is used as the metal matrix 10, examples of the copper alloy include CuAg, CuAl, CuSn, CuZr, and CrCu.

The metal matrix 10 is, for example, a sintered compact of metal powder containing copper (and optionally the other high thermal conductivity metal). In the present embodiment, the metal matrix 10 is formed of a sintered compact in which at least a part of the plurality of diamond particles 20 is embedded.

The diamond particles 20 includes at least any one of non-coated diamond particles not including a metal-containing coating layer on the surface or coated diamond particles including a metal-containing coating layer on the surface. From the viewpoint of improving the adhesiveness between diamond and metal particles or obtaining dispersibility, the coated diamond particles are more preferable.

The lower limit of a volume content of the diamond particles 20 in the copper-diamond composite 30 is preferably 10 vol % or more, more preferably 20 vol % or more, and still more preferably 30 vol % or more. As a result, the thermal conductivity of the copper-diamond composite 30 is enhanced.

On the other hand, the upper limit of the volume content of the diamond particles 20 in the copper-diamond composite 30 is, for example, preferably 80 vol % or less, more preferably 70 vol % or less, and still more preferably 65 vol % or less. As a result, in the copper-diamond composite 30, for example, attachment of the copper powder to the periphery of the diamond particles 20 deteriorates. As a result, the remaining of large pores can be suppressed, and a structure having excellent manufacturing stability can be realized.

When the coated diamond particles are used as the diamond particles 20, the metal-containing coating layer in the coated diamond particles may contain molybdenum, tungsten, chromium, zirconium, hafnium, vanadium, niobium, tantalum, and alloys thereof. These metals may be used alone or may be used in combination of two or more kinds. In addition, the metal-containing coating layer is configured to cover at least a part or all of the particle surfaces.

(Heat Dissipation Member)

Figure 2:
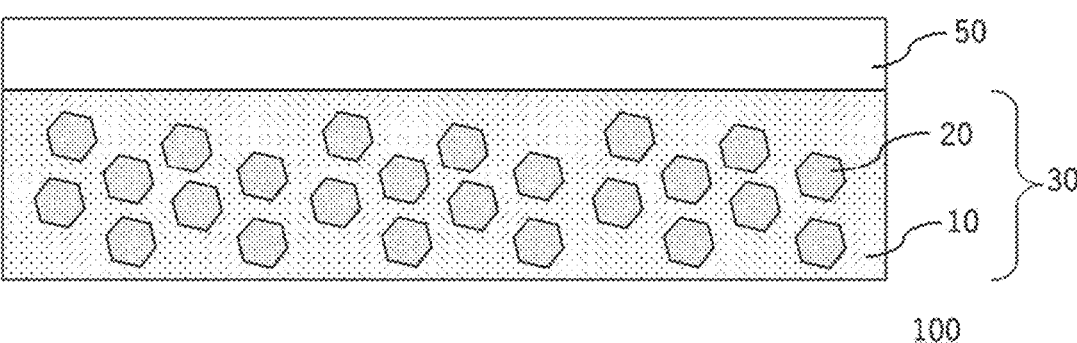
FIG. 2 is a schematic cross-sectional view illustrating one example of a configuration of a heat dissipation member according to the present embodiment.

FIG. 2 is a schematic cross-sectional view illustrating one example of a configuration of the heat dissipation member according to the present embodiment.

A heat dissipation member 100 according to the present embodiment includes: the copper-diamond composite 30; and a metal film 50 that is joined to at least one face of the copper-diamond composite 30.

The lower limit of the thermal conductivity of the heat dissipation member 100 is, for example, 600 W/m·K or higher, preferably 630 W/m·K or higher, and more preferably 650 W/m·K or higher. As a result, the heat dissipation characteristics of the heat dissipation member are enhanced.

On the other hand, the upper limit of the thermal conductivity of the heat dissipation member 100 is not particularly limited and is, for example, 780 W/m·K or lower, preferably 760 W/m·K or lower, and more preferably 760 W/m·K or lower.

The metal film 50 only needs to be formed on at least one face of the copper-diamond composite 30 and may be formed on each of both faces of the flat copper-diamond composite 30.

The metal film 50 may contain one or two or more selected from the group consisting of copper, silver, gold, aluminum, nickel, zinc, tin, and, magnesium. It is preferable that the metal film 50 includes the same metal as the metal as the main component in the metal matrix 10, and it is more preferable that the metal film 50 includes at least copper or a copper alloy.

The content of copper as the main component with respect to 100 masse of the metal film 50 is preferably 50 mass % or more, more preferably 60 mass % or more, still more preferably 70 mass % or more, still more preferably 80 mass % or more, and most preferably 90 mass' or more.

The upper limit of the content of copper as the main component with respect to 100 mass % of the metal film 50 is not particularly limited and may be 100 mass % or less or may be 99 mass % or less.

The upper limit of the thickness of the metal film 50 is preferably 150 μm or less, more preferably 120 μm or less, and still more preferably 100 μm or less. As a result, the thermal conductivity of the heat dissipation member is enhanced.

On the other hand, the lower limit of the thickness of the metal film 50 is preferably 10 μm or more, more preferably 15 μm or more, and still more preferably 20 μm or more. As a result, the adhesion strength with the composite or the durability of the metal film 50 itself is enhanced.

The metal film 50 is obtained, for example, using a sputtering method or a plating method.

An electronic device according to the present embodiment includes the above-described heat dissipation member and an electronic component that is provided over the heat dissipation member.

Examples of the electronic component include a semiconductor element. Specific examples of the semiconductor element include a power semiconductor, an image display element, a microprocessor unit, and a laser diode.

The heat dissipation member is used as a heat sink, a heat spreader, or the like. The heat sink dissipates heat generated during an operation of the semiconductor element to an external space, and the heat spreader spreads heat generated from the semiconductor element to other members.

The electronic component may be provided in the heat dissipation member directly or indirectly through a ceramic substrate or the like.

An example of a method of manufacturing the copper-diamond composite according to the present embodiment will be described.

The example of the method of manufacturing the copper-diamond composite includes a raw material mixing step and a sintering step.

In the raw material mixing step, metal powder including copper such as copper powder and diamond particles are mixed to obtain a mixture.

To the mixing of the raw material powders, various methods such as a dry process or a wet process can be applied, and a dry mixing method may also be used.

In the firing step, the mixture of the metal powder and the diamond particles is fired to obtain a composite sintered compact (copper-diamond composite) of copper and the diamond particles.

The firing temperature can be appropriately selected depending on metal species in the metal powder. The firing temperature of the copper powder is preferably 800° C. or higher and 1100° C. or lower and more preferably 850° C. or higher and 1000° C. or lower. By adjusting the firing temperature to be 800° C. or higher, the copper-diamond composite is densified to obtain a desired thermal conductivity. By adjusting the firing temperature to be 1100° C. or lower, deterioration of the interface of the diamond particles caused by graphitization can be suppressed, and a decrease in the thermal conductivity of diamond itself can be prevented.

The firing time is not particularly limited and is preferably 5 minutes or longer and 3 hours or shorter and more preferably 10 minutes or longer and 2 hours or shorter. By adjusting the firing time to be 5 minutes or longer, the copper-diamond composite is densified to obtain a desired thermal conductivity. By adjusting the firing time to be 3 hours or shorter, the formation of a carbide between diamond in the coated diamond particles and the metal with which the surfaces are coated or an increase in film thickness can be suppressed, and a decrease in thermal conductivity caused by phonon scattering or the occurrence of cracks caused by a difference in linear expansion coefficient can be suppressed. In addition, the productivity of the composite is improved.

In the firing step, a pressureless sintering method or a pressure sintering method may be used, and a pressure sintering method is preferable to obtain a dense composite.

Examples of the pressure sintering method include hot press sintering, spark plasma sintering (SPS), and hot isotropic pressure sintering (HIP). In hot press sintering or SPS sintering, the pressure is preferably 10 MPa or higher and more preferably 30 MPa or higher. On the other hand, in hot press sintering or SPS sintering, the pressure is preferably 100 MPa or lower. By adjusting the pressure to be 10 MPa or higher, the copper-diamond composite is densified to obtain a desired thermal conductivity. By adjusting the pressure to be 100 MPa or lower, the fracture of diamond can be prevented, an increase in diamond interface or a decrease in adhesiveness between a diamond fracture surface and metal can be prevented, and a decrease in the thermal conductivity of diamond itself can be prevented.

In addition, one example of a method of manufacturing the heat dissipation member includes a film forming step of forming a metal film on the composite obtained as described above.

In the film forming step, the metal film 50 is formed on at least a part of the surface of the copper-diamond composite 30.

As a method of forming the metal film, a general method such as a sputtering method, a plating method, or a pressure co-firing method using copper foil may be adopted. However, a sputtering method may be used to reduce the film thickness.

In addition, at least a part of the surface of the metal film may be ground and polished. As a result, the surface smoothness of the metal film after the film forming step can be improved.

In addition, optionally, a smoothing step may be performed after the firing step. In the smoothing step, at least a part of the surface of the composite sintered compact is ground and polished.

In addition, an annealing step may be added and performed between the firing step and the smoothing step.

In addition, a step of performing processing such as shaping or perforating on the copper-diamond composite may be performed before the film forming step.

Hereinbefore, the embodiment of the present invention has been described. However, the embodiment is merely an example of the present invention, and various configurations other than the above-described configurations can be adopted. In addition, the present invention is not limited to the above-described embodiment, and modifications, improvements, and the like within a range where the object of the present invention can be achieved are included in the present invention.

EXAMPLES

Hereinafter, the present invention will be described in detail with reference to Examples. However, the present invention is not limited to the description of these Examples.
(Raw Materials)
Diamond Particles A
Diamond Particles B A particle size distribution (shape distribution/particle diameter distribution) of each of diamond particles A and B as raw materials was measured using an image particle size distribution analyzer (for example, Morphologi 4, manufactured by Malvern Panalytical Ltd.).

In a volume particle size distribution of particle diameter of the diamond particles, a particle diameter $D_{10}$ corresponding to a cumulative value of 10%, a particle diameter $D_{50}$ corresponding to a cumulative value of 50%, and a particle diameter $D_{90}$ corresponding to a cumulative value of 90% were obtained.

In a volume particle size distribution of sphericity of the diamond particles, a sphericity $S_{10}$ corresponding to a cumulative value of 10%, a sphericity $S_{50}$ corresponding to a cumulative value of 50%, and a sphericity $S_{90}$ corresponding to a cumulative value of 90% were obtained.

In addition, in each of particle diameter classes where the particle diameters of the diamond particles were classified into four ranges including a range of the particle diameter $D_{10}$ or less, a range of more than the particle diameter $D_{10}$ and the particle diameter $D_{50}$ or less, a range of more than the particle diameter $D_{50}$ and the particle diameter $D_{90}$ or less, and a range of more than the particle diameter $D_{90}$, the sphericity was obtained.

In addition, in each of the particle diameter distribution and the shape distribution (sphericity distribution), a number average (number-based average particle diameter of the diamond particles) was calculated.

As each of these values, an average value of two measured values is shown in Table 1.

The sphericity and the particle diameter were defined as follows.

Sphericity: a ratio between the circumferential length of a circle having the same area as a projected object and the circumferential length of the object Particle diameter: the maximum length between two points on the contour of a particle image

TABLE 1

| | Particle Diameter Distribution (μm) | | | | Sphericity Distribution | | | | Sphericity for Each Particle Diameter Class | | | |
|---|---|---|---|---|---|---|---|---|---|---|---|---|
| | $D_{10}$ | $D_{50}$ | $D_{90}$ | Number Average | $S_{10}$ | $S_{50}$ | $S_{90}$ | Number Average | $\leq D_{10}$ | $D_{10}<, \leq D_{50}$ | $D_{50}<, \leq D_{90}$ | $D_{90}<$ |
| Diamond Particles B | 163.4 | 187.5 | 216.6 | 184.4 | 0.796 | 0.861 | 0.908 | 0.857 | 0.865 | 0.862 | 0.852 | 0.831 |
| Diamond Particles A | 150.5 | 164.6 | 183.1 | 164.6 | 0.877 | 0.932 | 0.963 | 0.926 | 0.909 | 0.928 | 0.929 | 0.918 |

<Preparation of Composite>

Example 1

Copper powder and the diamond particles A (coated with Mo) were weighed at 50 vol %:50 vol %, and the weighed powders were uniformly mixed using a V-shape mixer to obtain a mixture (raw material mixing step).

Next, using a SPS firing device, the obtained mixture was filled in a mold and was heated and sintered at 900° C. for 1 hour under a pressure condition of 30 MPa. As a result, a disk-shaped composite sintered compact (copper-diamond composite) where a plurality of diamond particles were dispersed in the copper matrix was obtained (sintering step).

The content of the diamond particles in the copper-diamond composite was 50 vol %.

When the thermal conductivity of the copper-diamond composite was measured using a laser flash method, the result was 747 W/m·K. The measurement using the laser flash method was performed at room temperature according to JIS H 7801 after coating the sample surface with carbon.

Examples 2 to 4 and Comparative Examples 1 to 4

Copper-diamond composites were obtained using the same method as that of Example 1, except that the kinds of the diamond particles and the contents of the diamond particles were changed according to Table 2. The same evaluation as that of Example 1 was performed on the obtained composites.

TABLE 2

| | Unit | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Diamond Particles | | A | A | A | A | E | B | B | B |
| Content of Diamond Particles | vol % | 50 | 45 | 40 | 35 | 50 | 45 | 40 | 35 |
| Thermal Conductivity of Composite | W/m · K | 747 | 732 | 686 | 637 | 540 | 589 | 600 | 573 |

Table 2 shows the results that, in the copper-diamond composites according to Examples 1 to 4, as compared to Comparative Examples 1 to 4, the sphericity of the diamond particles was higher, thus and the thermal conductivity was improved.

By using the composite according to Examples, a heat dissipation member having excellent thermal conductivity can be provided.

The present application claims priority based on Japanese Patent Application No. 2021-128792, filed on Aug. 5, 2021, the entire content of which is incorporated herein by reference.

REFERENCE SIGNS LIST

10: metal matrix

20: diamond particle

30: copper-diamond composite

50: metal film

100: heat dissipation member

The invention claimed is:

1. A copper-diamond composite comprising:
a plurality of diamond particles that are dispersed in a copper-based metal matrix, wherein
the metal matrix is a sintered compact of metal powder, and
when a particle size distribution, including shape distribution and particle diameter distribution, of the diamond particles is measured using an image particle size distribution analyzer, the particle size distribution includes information of a projected object of the plurality of diamond particles obtained by the image particle size distribution analyzer, a number average of a sphericity distribution of the diamond particles is 0.90 or more, and sphericity is calculated as X/Y, wherein X denotes the circumferential length of a circle having the same area as the projected object and Y denotes the circumferential length of the projected object.

2. The copper-diamond composite according to claim 1, wherein
a sphericity $S_{50}$ corresponding to a cumulative value of 50% in a volume particle size distribution of sphericity of the diamond particles is 0.87 or more.

3. The copper-diamond composite according to claim 1, wherein a sphericity $S_{90}$ corresponding to a cumulative value of 90% in a volume particle size distribution of sphericity of the diamond particles is 0.91 or more.

4. The copper-diamond composite according to claim 1, wherein a sphericity $S_{10}$ corresponding to a cumulative value of 10% in a volume particle size distribution of sphericity of the diamond particles is 0.8 or more.

5. The copper-diamond composite according to claim 1, wherein a number average of a particle diameter distribution of the diamond particles is 180 μm or less.

6. The copper-diamond composite according to claim 1, wherein a particle diameter $D_{50}$ corresponding to a cumulative value of 50% in a volume particle size distribution of particle diameter of the diamond particles is 180 μm or less.

7. The copper-diamond composite according to claim 1, wherein a particle diameter $D_{90}$ corresponding to a cumulative value of 90% in a volume particle size distribution of particle diameter of the diamond particles is 210 μm or less.

8. The copper-diamond composite according to claim 1, wherein a particle diameter $D_{10}$ corresponding to a cumulative value of 10% in a volume particle size distribution of particle diameter of the diamond particles is 160 μm or less.

9. The copper-diamond composite according to claim 1, wherein a sphericity of the diamond particles belonging to a range where a particle diameter of the diamond particles is more than a particle diameter $D_{50}$ and equal to or less than a particle diameter $D_{90}$ is 0.90 or more.

10. The copper-diamond composite according to claim 1, wherein a sphericity of the diamond particles belonging to a range where a particle diameter of the diamond particles is more than a particle diameter $D_{10}$ and equal to or less than a particle diameter $D_{50}$ is 0.90 or more.

11. The copper-diamond composite according to claim 1, wherein a thermal conductivity is 610 W/m·K or higher.

12. The copper-diamond composite according to claim 1, wherein a volume content ratio of the diamond particles is 10 vol % or more.

13. A heat dissipation member comprising:

the copper-diamond composite according to claim 1; and a metal film that is joined to at least one face of the copper-diamond composite.

14. An electronic device comprising:

the heat dissipation member according to claim 13; and an electronic component that is provided over the heat dissipation member.

* * * * *